United States Patent [19]
Pong

[11] Patent Number: 5,987,092
[45] Date of Patent: Nov. 16, 1999

[54] METHOD OF SOFT X-RAY IMAGING

[75] Inventor: William Pong, Honolulu, Hi.

[73] Assignee: University of Hawaii, Hi.

[21] Appl. No.: 09/038,806

[22] Filed: Mar. 11, 1998

Related U.S. Application Data

[62] Division of application No. 08/690,189, Jul. 18, 1996, Pat. No. 5,778,042.
[51] Int. Cl.[6] ........................................................... G03H 5/00
[52] U.S. Cl. .................................................. 378/36; 378/210
[58] Field of Search ................................................ 378/36

[56] References Cited

U.S. PATENT DOCUMENTS

| | | | |
|---|---|---|---|
| 3,138,059 | 6/1964 | White | 88/24 |
| 3,976,383 | 8/1976 | Olsen | 356/166 |
| 4,383,016 | 5/1983 | Postupack | 430/5 |
| 4,586,822 | 5/1986 | Tanimoto | 356/394 |
| 4,718,767 | 1/1988 | Hazama | 356/381 |
| 5,123,743 | 6/1992 | Feldman | 356/394 |
| 5,124,927 | 6/1992 | Hopewell et al. | 364/468 |
| 5,314,768 | 5/1994 | Sethi | 430/5 |

OTHER PUBLICATIONS

El–kareh, Badih, *Fundamentals of Semiconductor Processing Technology*, p. 234–243 (1995).
Freeman, R.R. et al., "X–ray Reduction Imaging at the NSLS," *Synchrotron Radiation News*, 4(2):13–15 (1991).
O. Hayes Griffith et al., *Proc. Natl. Acad. Sci. USA*, 86:1826–1830 (1989) Biological Photocathodes.
R. D. Guenther, *Modern Optics*, Ch. 12 (1990).
Nemecheck, "Microelectronics Industry Optimizes Operations with Ultraviolet Optics," *Laser Focus World* pp. 113–118 (Apr. 1995).
Hibbs et al., "193–nm Lithography at MIT Lincoln Lab," *Solid State Technology* pp. 69–78 (Jul.1995).
Stojanoff et al., "X–ray Topography: An Old Technique with a New Application," *Synchrotron Radiation News*, 9(1):25–26 (1996).
Howells et al., "X–ray Microscopes," *Scientific American* pp. 88–94 (Feb. 1991).
Reynolds, "Elusive Mask Defects: Reticle Transmission Defects," *Solid State Technology* pp. 91–92 (Nov. 1994).
Oberai, "Lithography—Challenges of the Future," *Solid State Technology*, pp. 123–28 (Sep. 1987).

*Primary Examiner*—Craig E. Church
*Attorney, Agent, or Firm*—Medlen & Carroll, LLP

[57] ABSTRACT

A method for inspecting masks used in x-ray lithography is described. An x-ray lithography mask is placed over a glass surface, followed by exposure of the mask and glass surface to soft x-rays. Portions of the mask absorb the soft x-rays while other portions of the mask, corresponding to circuit elements, allow the soft x-rays to strike the glass surface. The soft x-rays striking the glass surface cause the glass surface to darken, thereby forming an image of the circuit pattern in the glass surface corresponding to the stenciled circuit in the mask. An inspection of the image can reveal any defects in the x-ray lithography mask.

9 Claims, 6 Drawing Sheets

METHOD OF SOFT X-RAY IMAGING

This is a divisional of application Ser. No. 08/690,189, filed on Jul. 18, 1996 now U.S. Pat. No. 5,778,042.

FIELD OF THE INVENTION

This invention relates to the field of x-ray lithography. More particularly, this invention relates to forming images on glass surfaces with soft x-rays.

BACKGROUND OF THE INVENTION

Currently, integrated circuit (IC) chip patterns are etched out of semiconductors using photolithography, ultraviolet lithography, or x-ray lithography. Photolithography ultraviolet, and x-ray lithography are processes by which a semiconductor is first covered with a layer of photosensitive material (i.e. photoresist). This layer is then covered with a stencil-like mask in the shape of the desired electric circuit. When the semiconductor is exposed to visible light, ultraviolet light, or x-rays a chemical reaction occurs in the exposed areas of the photosensitive material or photoresist Then, depending on the process, either the exposed or unexposed area of the photosensitive material or photoresist is etched away by acid (i.e. a mixture of $H_2SO_4$ and $H_2O_2$), leaving a pattern in the shape of the mask.

One drawback with all lithography methods, including x-ray lithography, is that extraordinary care is required to avoid defects in the masks since masks are used to manufacture millions of chips per mask. Because these masks create extremely complex and dense patterns millions of times over, inspection of these masks for defects is critical. There are two principal types of mask defects: (1) a spot, which is an area that absorbs radiation where it should not, and (2) a hole, which is an area that does not absorb radiation where it should. These defects may be formed in unpatterned areas, patterned areas, or on feature edges. There can also be hybrids or combinations of these two principal types of defects.

There have been a variety of approaches to x-ray mask inspection. A typical approach involves inspection of the mask with an electron beam in reflection or transmission. The response of a mask to electrons is not identical to its response to x-rays, however, and the rate of inspection is typically slow.

Another approach is exemplified in U.S. Pat. No. 4,718,767 to Hazaam. A copy of a mask is made on a transparent wafer coated with a photosensitive layer, and after development the resulting pattern on the wafer will be optically inspected. Drawbacks with this method are that (1) the wafers must be developed (i.e. chemical processing of the photoresist material exposed to the x-ray source) in order to examine the "spots;" and (2) numerous wafers must be used for multiple inspections throughout a production, which can be relatively expensive. Direct optical inspection is lengthy, tedious, and inaccurate.

Another approach is described in U.S. Pat. No. 5,123,743 to Feldman. Feldman creates two exposures on the same wafer, one through a first mask onto a positive resist on the wafer, and one through a second, ostensibly identical mask, onto a negative resist on the same wafer. Both masks are either positive or negative. The resulting image on the wafer will be either a completely dark or completely light background, with defects represented as islands or "specks" on the wafer. Drawbacks with this method are that (1) the two mask images (positive and negative) must be precisely aligned on the wafer—if not, the necessary dark or light background will not be created; (2) the wafers must be developed in order to examine the "spots;" and (3) numerous wafers must be used for multiple inspections throughout a production run.

Thus, there remains a need for a simple, inexpensive and accurate method of inspecting x-ray lithography patterns.

SUMMARY OF THE INVENTION

The present invention contemplates a method of forming an image on a glass surface using soft x-rays, comprising the steps of: a) providing a source of soft x-rays and a glass surface; and b) exposing said glass surface to soft x-rays from said source of soft x-rays, whereby an image is formed on said glass surface, said image corresponding to areas on said glass surface of exposure to said soft x-rays.

In one embodiment, the glass surface comprises sodium. In another embodiment, said source of soft x-rays is a synchrotron. In yet another embodiment, said source of soft x-rays is an x-ray tube.

In yet another embodiment, the method of forming an image on a glass surface further comprises the step of positioning a mask between said glass surface and said source of soft x-rays prior to said exposing step, whereby said mask blocks said soft x-rays directed upon said glass surface.

In yet another embodiment, the method of forming an image on a glass surface further comprises the steps of a) positioning a splitting means between said glass surface and said source of soft x-rays; and b) splitting said soft x-rays into two coherent beams whereby i) a first beam directly strikes said glass surface and ii) a second beam strikes an object and is then reflected toward and strikes said glass surface, whereby said first and second beams discolor said glass surface in such a way as to form a hologram image of said object. The present invention also contemplates a glass surface comprising a hologram formed in accordance with this process.

In one embodiment said source of soft x-rays is a soft x-ray laser. In another embodiment, said source of soft x-rays is an x-ray tube. In yet another embodiment, said splitting means comprises mirrors.

The present invention also contemplates a method for inspecting a semiconductor mask, comprising the steps of: a) providing a source of soft x-rays, a glass surface, and a semiconductor mask for creating integrated circuits; b) positioning said semiconductor mask in contact with said glass surface; c) positioning said source of soft x-rays so that said semiconductor mask is between said glass surface and said source of soft x-rays; d) irradiating said glass surface with soft x-rays from said source of soft x-rays whereby said semiconductor mask blocks a portion of said soft x-rays from striking said glass surface so that regions of said glass surface exposed to said soft x-rays discolor while regions of said glass surface not exposed to said soft x-rays do not discolor; and e) inspecting said discoloration on said glass surface for defects which correspond to defects in said semiconductor mask. The present invention also contemplates a glass surface comprising an image of an integrated circuit formed in accordance with this process.

In another embodiment, said step of inspecting said glass surface further comprises the steps of: a) applying a thin film of a photoelectron-emitting material to said glass surface; b) projecting a blue light from behind said glass surface, through a back side of said glass surface, through regions of said glass surface not discolored, and through said photoelectron-emitting material in order to cause electron emissions from portions of said photon-emitting material corresponding to nondiscolored regions of said glass surface; and c) analyzing said electron emissions with a photoelectron microscope.

In one embodiment, said photoelectron-emitting material is cesium. In another embodiment, said photoelectron-emitting material is potassium.

The present invention also contemplates a method for forming a hologram in a glass surface comprising the steps of: a) providing a soft x-ray laser source, a glass surface, a splitting means and an object; b) positioning said splitting means between said glass surface and said soft x-ray laser source; c) projecting a laser beam from said soft x-ray laser source toward said splitting means; and c) splitting said laser beam into first and second coherent beams whereby said first beam travels toward and strikes said glass surface and said second beam reflects off said object and travels toward and strikes said glass surface whereby a hologram image of said object is formed on said glass surface. The present invention also contemplates a glass surface comprising a hologram formed in accordance with this method.

In one embodiment, said splitting means comprises mirrors. In yet another embodiment, said splitting means comprises a surface layer of Molybdenum-Silicon.

GENERAL DESCRIPTION OF THE INVENTION

Figure 1:
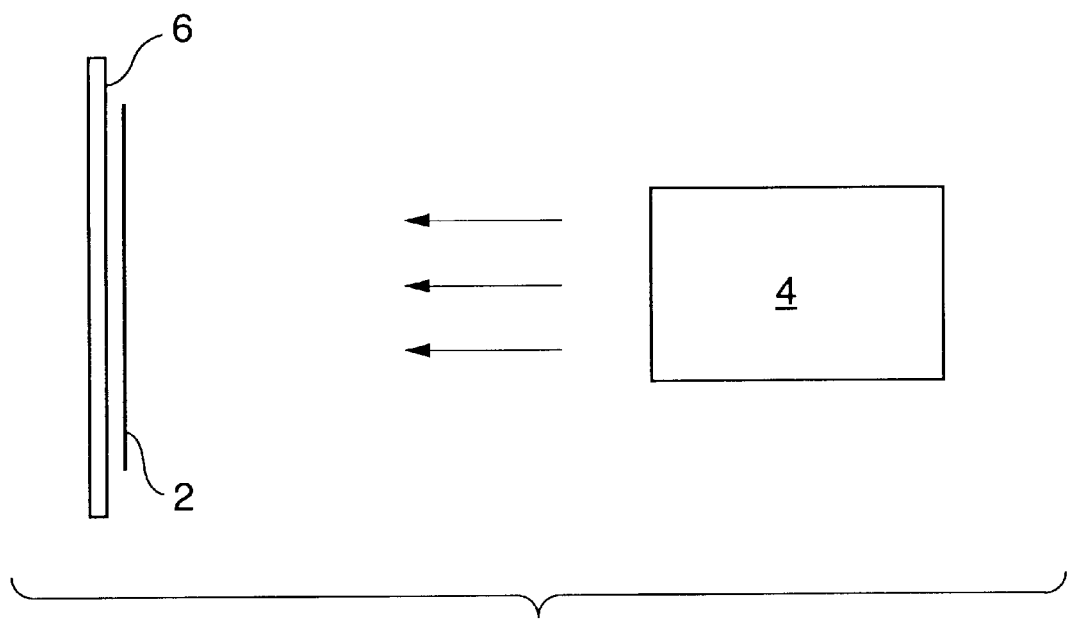
FIG. 1 illustrates a block diagram of the elements of the present invention used to inspect x-ray masks.

The present invention describes a method for creating an image on a glass surface by exposing the glass surface to soft x-rays. X-rays are regarded as part of the electromagnetic spectrum having wavelengths between 0.01 and 10 nanometers. X-rays generated from x-ray tubes typically have wavelengths between 0.01 and 2 nanometers, whereas high energy accelerators can generate x-rays with wavelengths shorter than 0.01 nanometers and synchrotron sources can generate x-rays having wavelengths longer than 2 nanometers. Soft x-rays for lithography are x-rays having a wavelength of between 0.8 and 2 nanometers. See B. El-Kareh, *Fundamentals of Semiconductor Processing Technology*, p. 234 (1995).

The present invention demonstrates that, due to a darkening of the glass surface when exposed to soft x-rays, images can be generated on the glass surface by controlling the pattern of exposure on the glass surface. In the semiconductor field, this can be accomplished by overlaying a mask on the glass surface so that an inverse image of the mask is generated on the glass surface. By "inverse image" it is meant that those areas exposed to the light will darken while those areas covered by the mask remain unchanged.

In a preferred embodiment of the present invention, an x-ray mask having a stencil image of a circuit pattern can be placed between a glass surface and a soft x-ray source. The x-ray mask can be placed either in close proximity to the glass surface or in contact with the glass surface, depending on the application. By "stencil image" it is meant that the x-ray mask has gaps in the shape of circuit lines which are transparent to soft x-rays, allowing the soft x-rays to pass through. The remaining portions of the x-ray mask block or absorb the soft x-rays. In this manner, an image of the x-ray mask's circuit pattern is formed on the glass surface as a discolored region. These discolored regions can then be inspected for defects in the x-ray mask.

This embodiment of the present invention provides a method that allows for greater accuracy than inspecting the masks themselves, because defects transferred from the masks to the semiconductors may not be easily identified on the masks themselves. It is also cheaper, quicker and more efficient than inspecting resulting ICs because it does not require the use of semiconductor wafers or the development of a photosensitive layer.

In an alternative embodiment, soft x-ray diffraction and scattering patterns can be detected. For example, holograms can be generated in glass surfaces by taking advantage of glass surface discoloration resulting from light waves diffracted off an object. In this alternative preferred embodiment, the glass surface could be glass film deposited on a transparent substrate. In this case, the surface need not be flat.

In this alternative embodiment, a beam-splitting means (i.e. mirrors) is positioned between a glass surface and a soft x-ray laser for dividing the laser beam into two beams. The first beam continues directly toward the glass surface while the second beam is reflected off an object and then toward the glass surface. The interference image formed in the glass surface by these two beams is a hologram. The image of the object can be reconstructed from the hologram by shining blue light from the back of the glass surface.

DETAILED DESCRIPTION OF PARTICULAR EMBODIMENTS

The following description serves to illustrate particular embodiments and aspects of the present invention and is not to be construed as limiting the scope thereof.

In considering the method of soft x-ray imaging on glass surfaces as described in this application, certain definitions are helpful. "Adjacent to" means in close proximity (of one object to another) without contact. "Blue light" is light having a wavelength of approximately 450 to 490 nanometers. A "boat" refers to any means for holding a specimen of the photoelectron emitter while the emitter is being heated to form vapors of the emitter. "Coherent beams" are beams having a fixed phase relation with respect to one another. In other words, the phase of the waveform corresponding to the beams, remains constant during the resolving time of an observer. "Defects" are anomalous conditions in a semiconductor mask such as holes (i.e. clear areas in the mask) and spots (i.e. opaque areas in the mask). "Discolor" and "discoloration" refers to the color change in the glass surface due to exposure to soft x-rays. In the example provided below, the change was from a clear glass to glass having a brown-opaque color. An "evaporator chamber" is a vacuum chamber wherein a photoelectron emitter such as cesium or potassium is heated, causing vapors of the photoelectron emitter to be formed. A coating of the photoelectron emitter can be formed on a glass surface by placing the glass surface in the chamber such that the vapors contact the glass surface. "Exposing" means allowing light to strike the exposed surface of an object, such as glass. A "gate valve" refers to a means for sealing the evaporation chamber of the system illustrated in FIG. 3 (i.e. the region of the system to the right of the gate valve in FIG. 3) from the region of the system to the left of the gate valve.

"Holograms" are three-dimensional images of an object formed by recording, on a two dimensional surface, the pattern of interference formed by coherent beams. "Integrated circuits" are circuits whose components and connecting wires are made by processing distinct areas of a chip of semiconductor material. A "linear motion manipulator" refers to any means (e.g. a mechanically-driven platform) or for allowing a user to control placement of the glass surface in the device illustrated in FIG. 3. A "mask" is a stencil for creating semiconductors wherein certain regions of the mask allow light having a specific wavelength (i.e. x-rays) to pass through while other regions block or absorb the light. "Photoelectron-emitting materials" are materials (such as cesium and potassium) that emit photoelectrons when excited by an energy source such as blue light. "Semiconductor masks" are stencils in the shape of a circuit pattern that are used to form circuit lines on a semiconductor. It should be noted that in the field of x-ray lithography, semiconductor masks are masks that allow a portion of x-rays to pass through while absorbing or blocking another portion of x-rays projected upon the semiconductor mask. A "shutter" is a means for controlling the amount of photoelectron emitter vapor that is allowed to contact the glass surface. "Soft x-rays" for lithography are x-rays having a wavelength of between 0.8 and 2 nanometers. A "splitting means" refers to any means (e.g. mirrors) for splitting x-rays into two distinct and coherent beams. By "two distinct and coherent beams" it is meant that the x-rays are divided into two separate x-ray beams with each beam travelling at a different path from each other and each beam having a fixed phase relation with respect to the other. "Synchrotrons" are high intensity x-ray sources (i.e. one such device can be found at the Lawrence Berkeley Laboratory in Berkeley, Calif.). "X-ray tubes" are electronic devices for generating x-rays. This is accomplished by accelerating electrons to a high velocity with an electrostatic field and then suddenly stopping them by collision with a solid body. X-rays are radiated from the points of collision.

The present invention takes advantage of a conventional glass surface's reaction to soft x-ray radiation. Glass surfaces take on a brownish color when exposed to soft x-rays, with the intensity of the color increasing as the exposure time or intensity of the soft x-ray irradiation increases. This discoloration is stable and durable, meaning that it remains constant after the irradiation has stopped.

While an understanding of the mechanism is not necessary for successful use of the invention, it is believed that sodium is the dominant metal impurity that causes the discoloration. An analysis of the relative atomic concentration of the impurity shows an increase of sodium with increasing exposure of the glass surface to the soft x-rays. The results suggest that the color-center sites (i.e. the regions of brownish color) involve trapped photoelectrons near the surface region of the glass, which causes mobile sodium ions to move toward the exposed glass surface. The discoloration for a given length of exposure depends on the intensity of the incident soft x-rays and the relative concentration of sodium in the glass. For soft x-ray lithography, there is presumedly an optimal concentration of sodium that can be put into the glass which would optimize the discoloration for a given soft x-ray intensity and exposure time.

Of course, it is possible that other impurities or elements, other than sodium, may be equally effective at reacting with soft x-rays to produce the desired discoloration.

Making Images On Glass

Because of the short wavelength of soft x-rays, images of small features formed on glass surfaces can be resolved. Such precision is well suited for inspecting x-ray lithography masks which create extremely small circuits having line widths less than or equal to 0.10 micrometers.

Referring to FIG. 1, an x-ray lithography mask 2 having a stencil image (i.e. a circuit pattern) is placed between a soft x-ray source 4 and a glass surface 6. One method is to place the mask in contact with the glass surface (as in contact photolithography or contact microradiography). In an alternative embodiment, the x-ray lithography mask may be placed adjacent to the glass surface. This embodiment has practical application in x-ray reduction lithography wherein a larger x-ray mask can be used to generate smaller resulting images using curved mirrors. See Synchrotron Radiation News, Vol. 4, No. 2, pp. 13–15 (1991).

In operation, as soft x-rays are emitted, the x-ray lithography mask 2 obstructs soft x-rays from striking the glass surface 6, thereby forming a pattern corresponding to the stencil image in the x-ray lithography mask 2. The resulting discoloration of the glass surface 6 can be examined for any defects. Examination of the resulting image provides a superior inspection method to direct examination of the mask, because the image is created in the same manner as an IC would be created from the mask.

Figure 2:
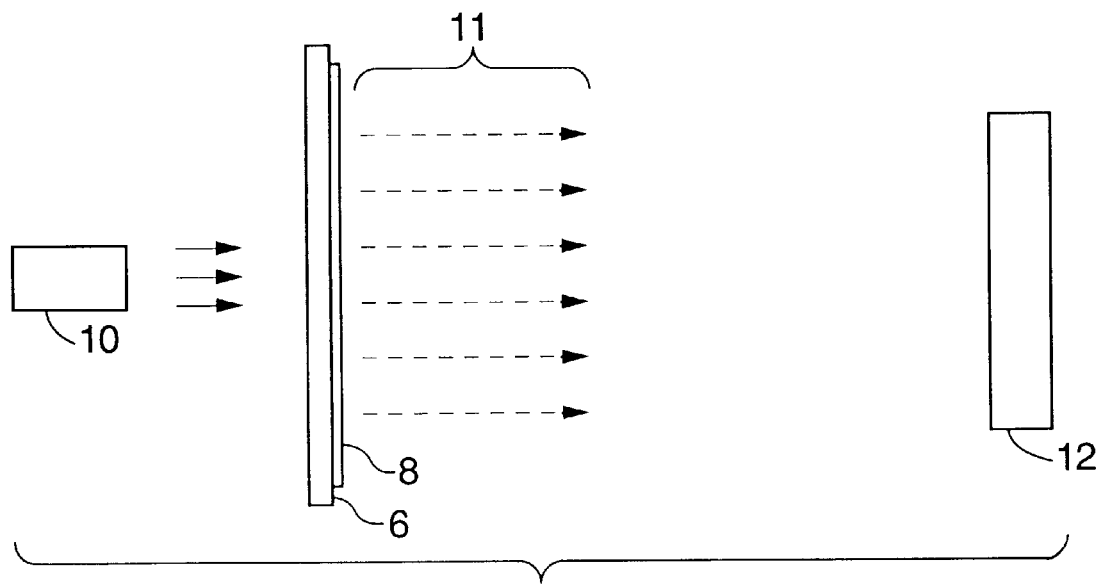
FIG. 2 illustrates a block diagram of a preferred method of inspecting the resulting image on the glass surface.

Referring now to FIG. 2, examination of the resulting image in the glass surface 6 (created by the operation described in the preceding paragraph) can be accomplished by photoelectron microscopy. See O. Hayes Griffith et al., Proc. Natl. Acad. Sci. USA, Vol. 86, pp. 1826–1830 (1989). A thin film of a photoelectron-emitting material 8 (e.g. cesium or potassium) is applied to the glass surface 6, after which, visible light of a specific frequency (e.g. blue light having a wavelength of approximately 450 to 490 nanometers) projected from a light source 10 through the back of the glass surface 6, causes electrons 11 to be emitted from the photoelectron-emitting material 8 in a pattern corresponding to the non-discolored regions of the glass. The photoelectron-emitting material 8, corresponding to the non-darkened regions, emits electrons because the non-discolored regions allow the light to pass through the glass surface 6 to the photoelectron-emitting material 8 thus producing electron emissions. The emitted electron pattern is then analyzed using a photoelectron microscope 12. Defects such as pinholes in the semiconductor mask 2 (shown in FIG. 1) which created the image in the glass surface 6 are detected as gaps in the x-ray mask, which allow soft x-ray photons to pass through. It is further contemplated that a computer can be coupled to the photoelectron microscope to digitize an image corresponding to the emitted electron pattern, so that the computer can compare the resulting image with a software representation of an accurate mask.

Figure 3:
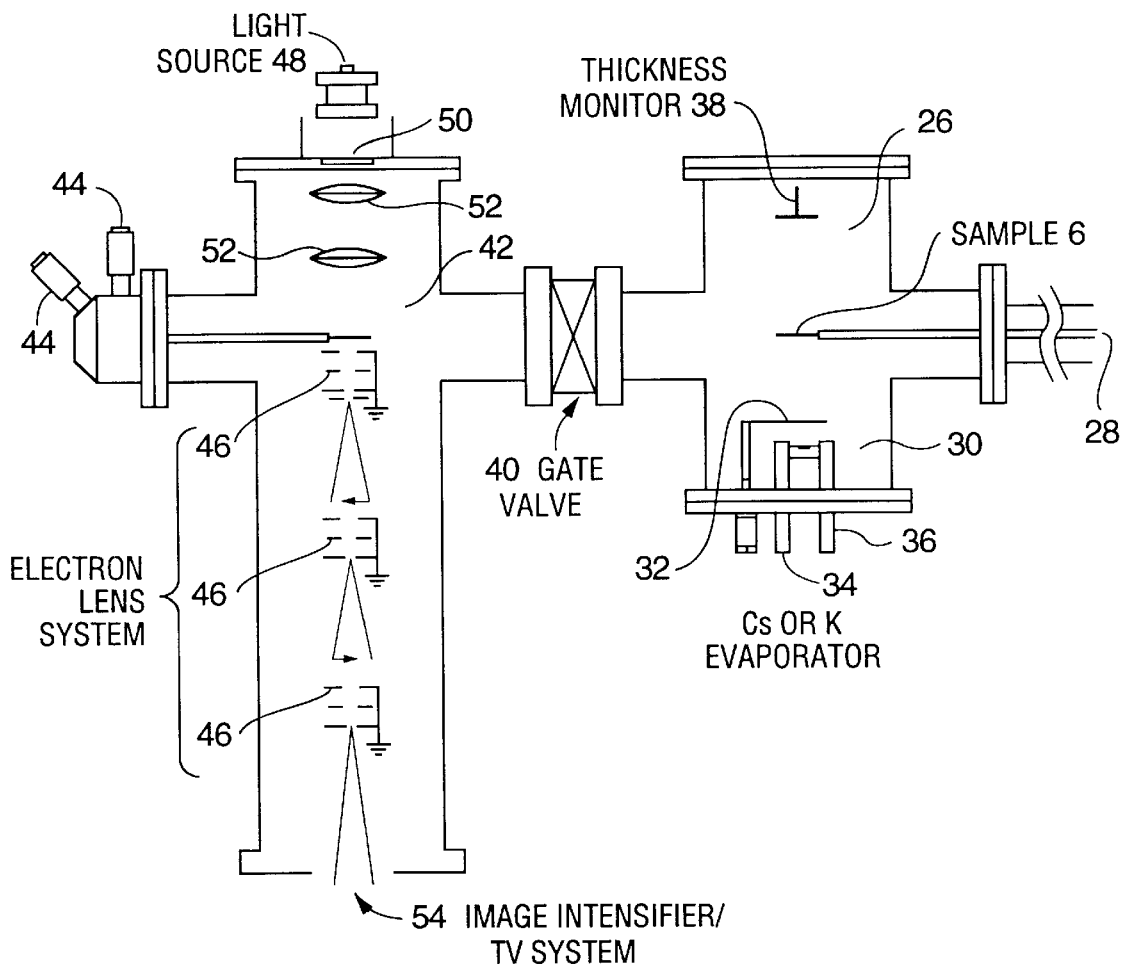
FIG. 3 illustrates a device for photoelectron microscopy.

FIG. 3 illustrates a photoelectron microscopy device used for viewing the image of the x-ray mask created on the glass surface 6 (see above). Starting from the right of the device in FIG. 3, the glass surface (sample) 6 is placed, with the glass surface 6 face down, in the evaporator chamber 26 using a linear motion manipulator 28 (controlled by manipulators 44). A boat 30, containing a photoelectron emitter such as cesium or potassium, is located beneath the glass surface 6, wherein the emitter is heated using the electrodes 34 and 36. As the emitter is heated, vapors rise from the boat 30 and pass through a shutter 32 which controls the amount of emitter deposition. As the vapors rise, a thin film is deposited on the glass surface 6. A film thickness monitor 38, is used to determine the film thickness deposited on the glass surface 6. Although the present invention will work with a variety of different deposition thicknesses, a preferred deposition thickness is 10 nanometers.

After deposition, the glass surface 6 is transferred to the photoelectron microscope chamber 42 through the gate valve 40 using the linear motion manipulator 28. The glass surface 6 is placed between an electronic lens system 46 and optical lenses 52. The electronic lens system allows for user controlled magnification and focusing of the glass surface. Optical lenses 52 assist in focusing blue light from light source 48, through window 50, through lenses 52, and toward the glass surface 6. When the blue light strikes the glass surface 6, photoelectrons from the photoelectron emitter deposited on the glass surface 6, are emitted from the glass surface 6. These photoelectrons are then magnified by the electron lens system 46 and imaged by the image intensifier/TV system 54 for viewing by a processor or user (not shown). The image intensifier/TV system 54 provides for viewing of the glass sample by a user.

An alternative embodiment of the present invention provides for the detection of diffraction and scattering patterns, which can be used, for example, to generate holograms on glass surfaces with high resolution. By incorporating x-ray laser beams, the present invention can also be used to generate holograms on glass surfaces.

Figure 4:
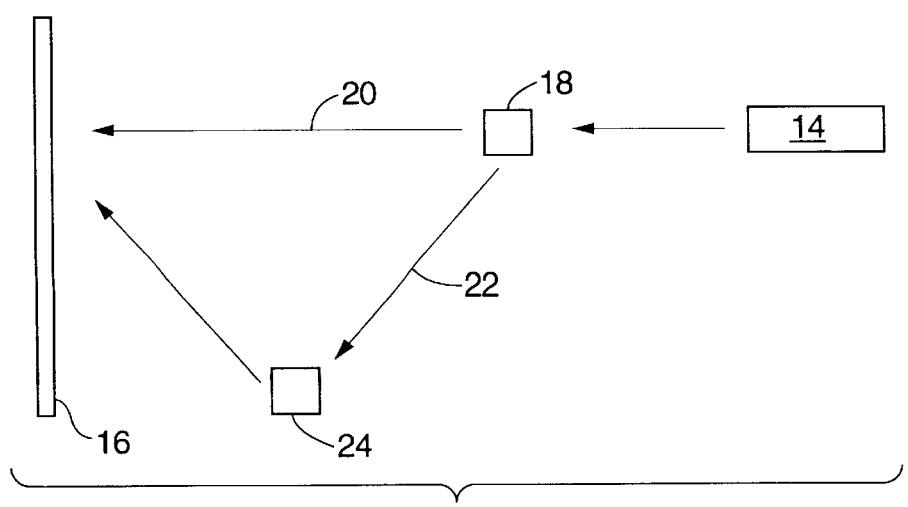
FIG. 4 illustrates a block diagram of the elements of the present invention used to generate a hologram.

FIG. 4 illustrates a block diagram of the elements of the present invention used in the hologram embodiment. Specifically, a soft x-ray laser source 14 directs an x-ray laser beam toward the glass surface 16. A splitting means 18 (i.e. special mirrors with, for example, Molybdenum-Silicon multilayer coatings) splits the laser beam into two beams 20 and 22. The first beam 20 continues directly toward the glass surface 16. The second beam 22 is reflected off an object 24 and back toward the glass surface 16. The resulting discoloration on the glass surface 16 will be able to generate a hologram. As shown in spectral absorbance measurements (FIG. 7), the resulting discoloration on the glass surface has greater absorption of blue light (having a wavelength of approximately 450 to 490 nanometers) than red light (having a wavelength of approximately 630 to 750 nanometers). The image of the object can be reconstructed from the hologram by shining blue light through the glass surface. The magnification is proportional to the ratio of the wavelength of the blue light to that of the soft x-rays. See R. D. Guenther, Modem Optics, John Wiley & Sons, New York, Chapter 12 (1990).

EXAMPLE 1

Thin glass plates, at room temperature, were cut from ordinary microscope slides and exposed to soft x-rays from a 300-watt source [Electron Spectroscopy Chemical Analysis System (ESCA) Model 5100, manufactured by Perkin-Elmer: Eden Prairie, Minn.], utilizing a magnesium target. By magnesium target, it is meant that a sample of pure magnesium (the "target") is bombarded with electrons resulting in the generation of soft x-rays emitted from, and having characteristics of, the target. By way of illustration, soft x-rays from a magnesium source have lower energy than those from aluminum. In this experiment, the soft x-ray emissions had a wavelength of approximately 1 nanometer. Although other soft x-rays wavelengths were not utilized, soft x-rays having other wavelengths should also work provided the wavelengths are sufficiently long so that absorption of the incident x-rays can occur. A preferred wavelength is 0.8–2 nanometers, while a most preferred wavelength is 0.83–0.99 nanometers.

X-ray photoelectron spectroscopy (XPS) was the technique used to identify the atomic elements on the surface of the glass plates. To identify elements such as sodium, x-rays from an aluminum target were used. X-rays from a target of pure aluminum are better than x-rays from a magnesium source in the XPS study of sodium because of their higher energy.

Figures 5A, 5B:
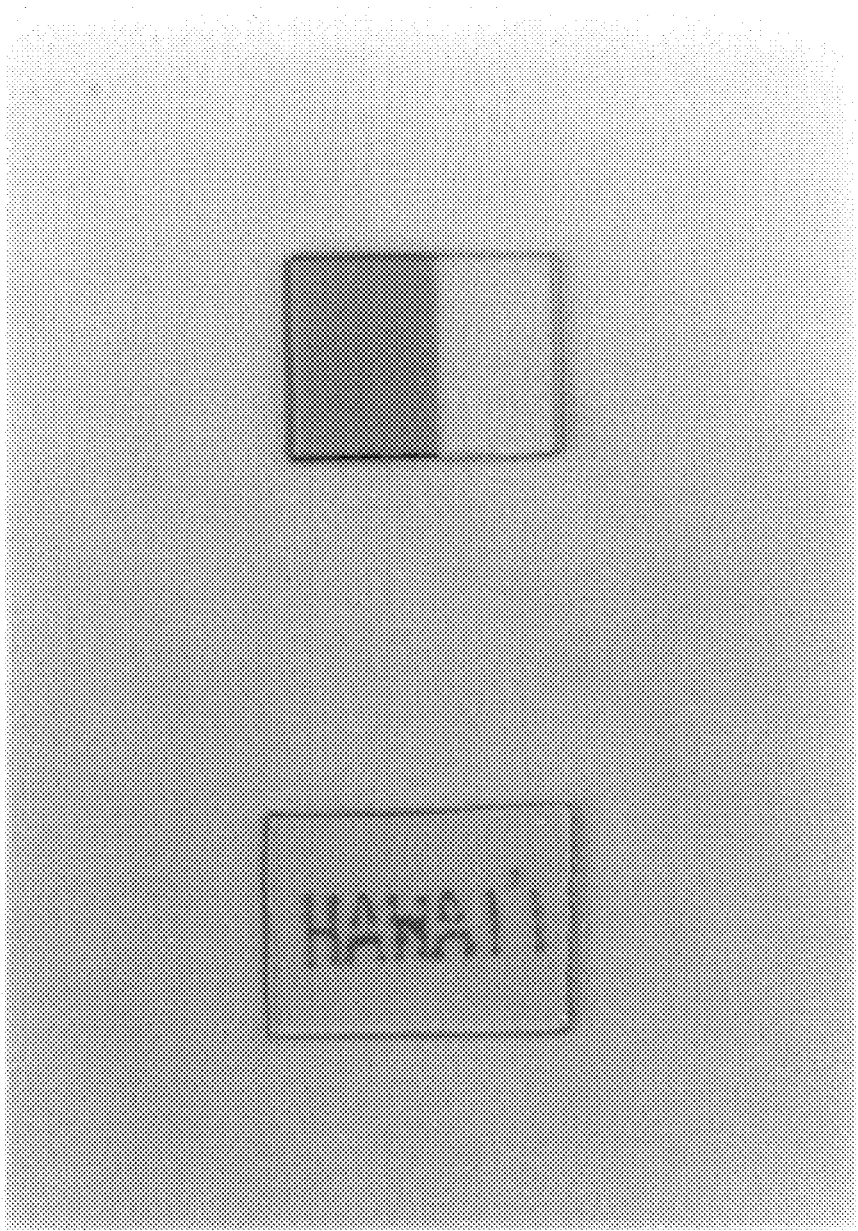
FIG. 5a illustrates a glass slide with the left half exposed to soft x-rays.
FIG. 5b illustrates a glass slide with the word "Hawai'i" imaged into the glass by using a mask containing that word.

FIG. 5a illustrates two halves of a microscope slide, with the left side having been exposed to soft x-rays from a magnesium target. This illustrates the coloration difference between an exposed slide region and a nonexposed slide region. FIG. 5b illustrates a microscope slide with the word "Hawai'i" imaged on its surface. The image was formed by placing a mask with the word "Hawai'i" in stencil over a glass slide and exposing the slide to soft x-rays. The mask can be made of any material able to absorb soft x-rays, thereby preventing them from penetrating the mask. In the present example, although a variety of different thicknesses could have been utilized, the mask was made using a thin metal foil of molybdenum, approximately 5 milli-inches thick (125 microns). The image of the word "Hawai'i" was stable and durable. Because of the short absorption depth of soft x-rays in glass, the darkening effect was limited to the surface region of the glass.

In examining the glass surfaces after exposure to soft x-rays, the samples were placed in the vacuum chamber of the ESCA for elemental analysis with x-rays from an aluminum target. An aluminum target was used here because the radiation emitted from it has higher energy than the magnesium target used to generate the discoloration. This higher energy was necessary to create an adequate reaction with the predicted sodium ions in the glass slide, because aluminum provides higher energy x-ray photons which excite the lowest energy level electron from sodium. This excitation enables the determination of the relative concentration of sodium at the glass surface region.

Figure 6:
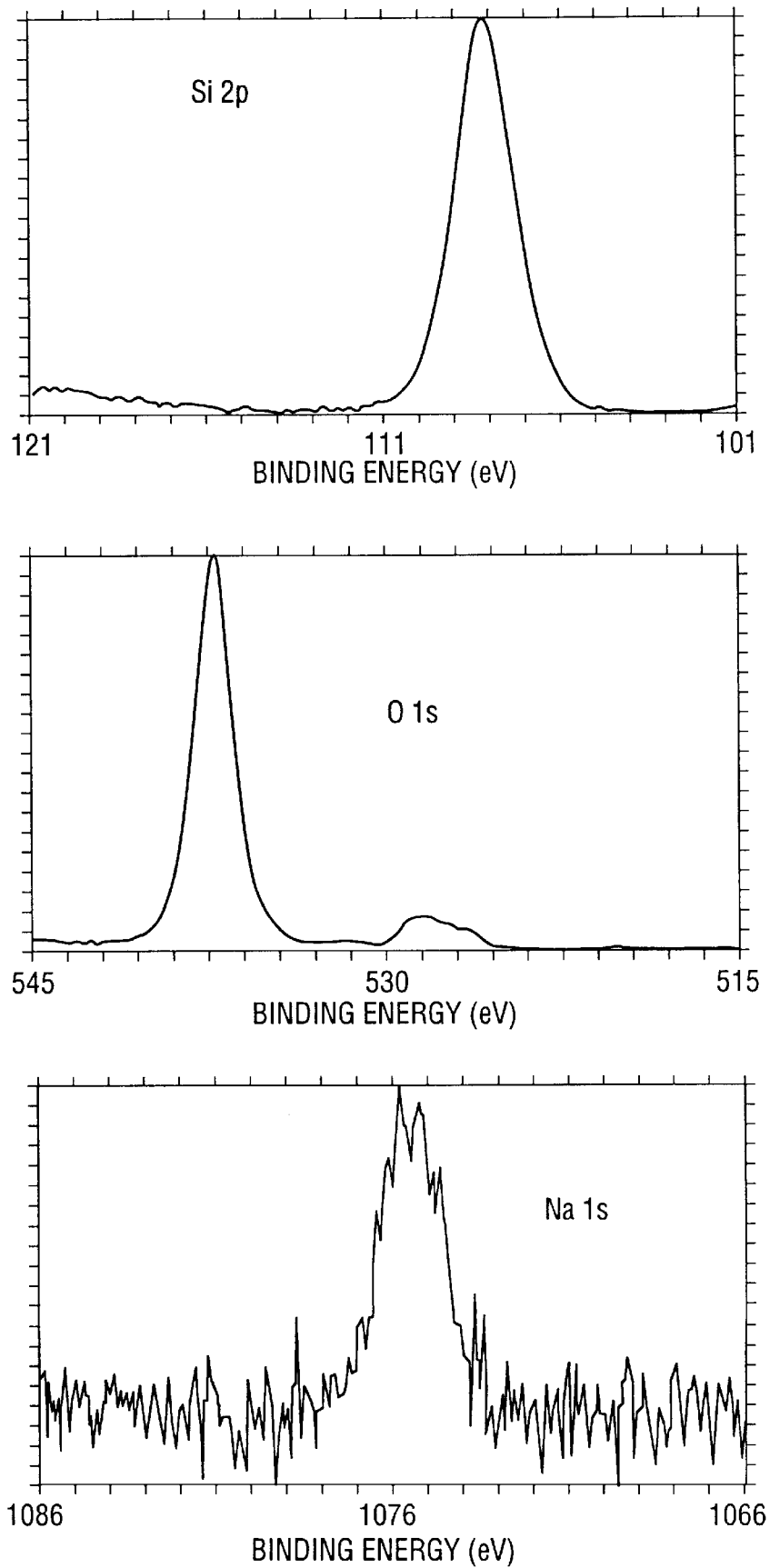
FIG. 6 illustrates the photoelectron spectra of the dominant elements (Si and O) and the most prominent metal impurity Na in the glass slides used in the present invention.

The photoelectron spectra of the dominant elements (Silicon and Oxygen) and the most prominent metal impurity (Na) in the glass slides used are shown in FIG. 6. Traces of other metals (Mg and K) and carbon were also detected. The relative atomic concentration of sodium was determined from the analysis of the photoelectron spectra before and after exposure to the soft x-rays from a 300-watt source with a magnesium target. Measurements were made after successive exposures at room temperature. The darkening of the glass sample surface was more noticeable with longer periods of exposure.

Figure 7:
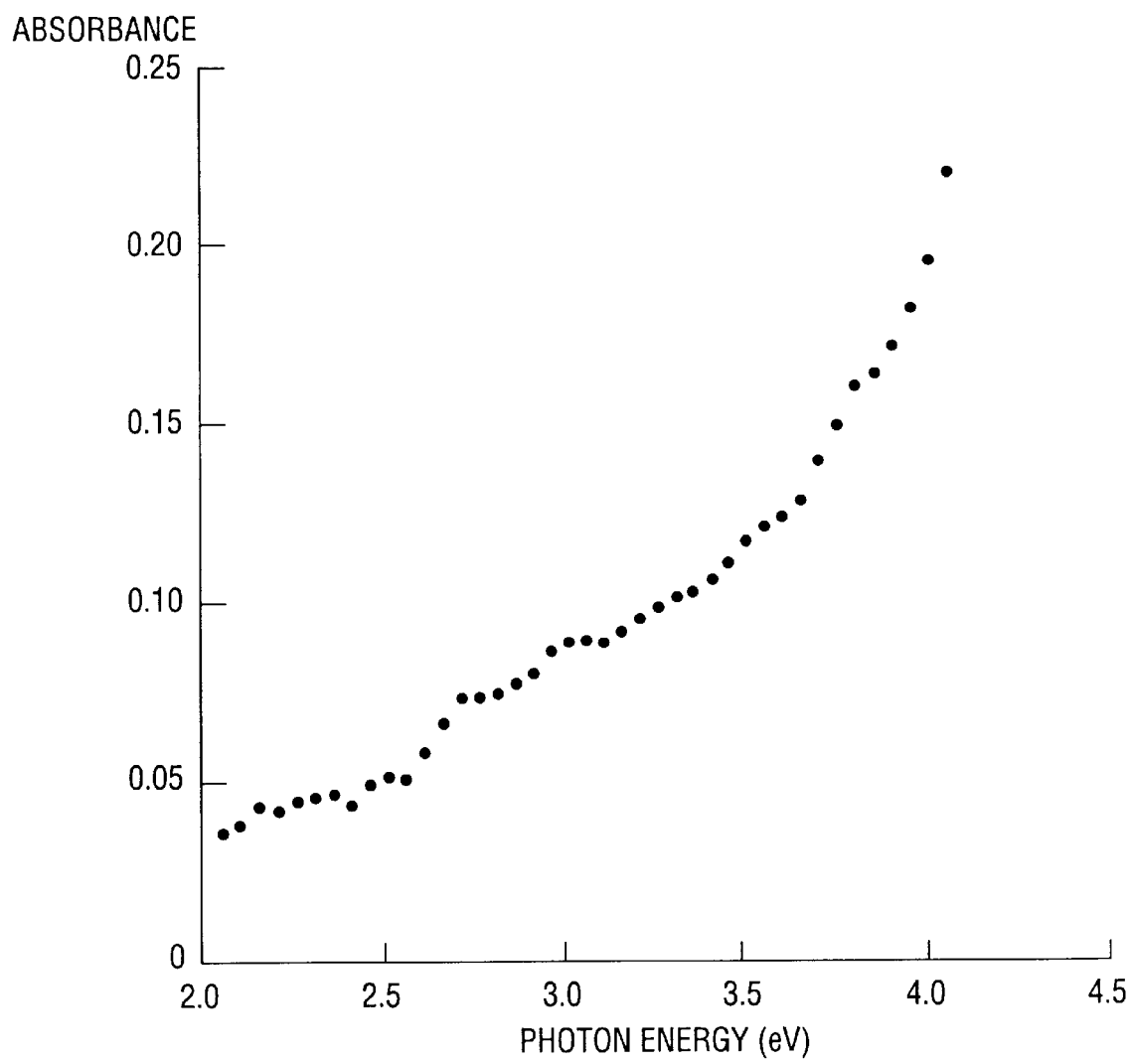
FIG. 7 illustrates the spectral absorbance of the darkened areas and indicates greater optical absorbance in the green and blue regions of visible light.

Spectral absorption measurements were made on the soft x-ray-induced darkened area of the glass surface. The absorbance was determined by measuring the transmittance of the darkened area and that of the clear area in the spectral range of 300–600 nm. The spectral absorbance results are shown in FIG. 7. The results indicate greater optical absorbance in the green (having a wavelength of approximately 490–570 nanometers) and blue (having a wavelength of approximately 450 to 490 nanometers) regions of the spectrum. This is consistent with the observed brown color of the exposed regions of the glass surfaces.

Figure 8:
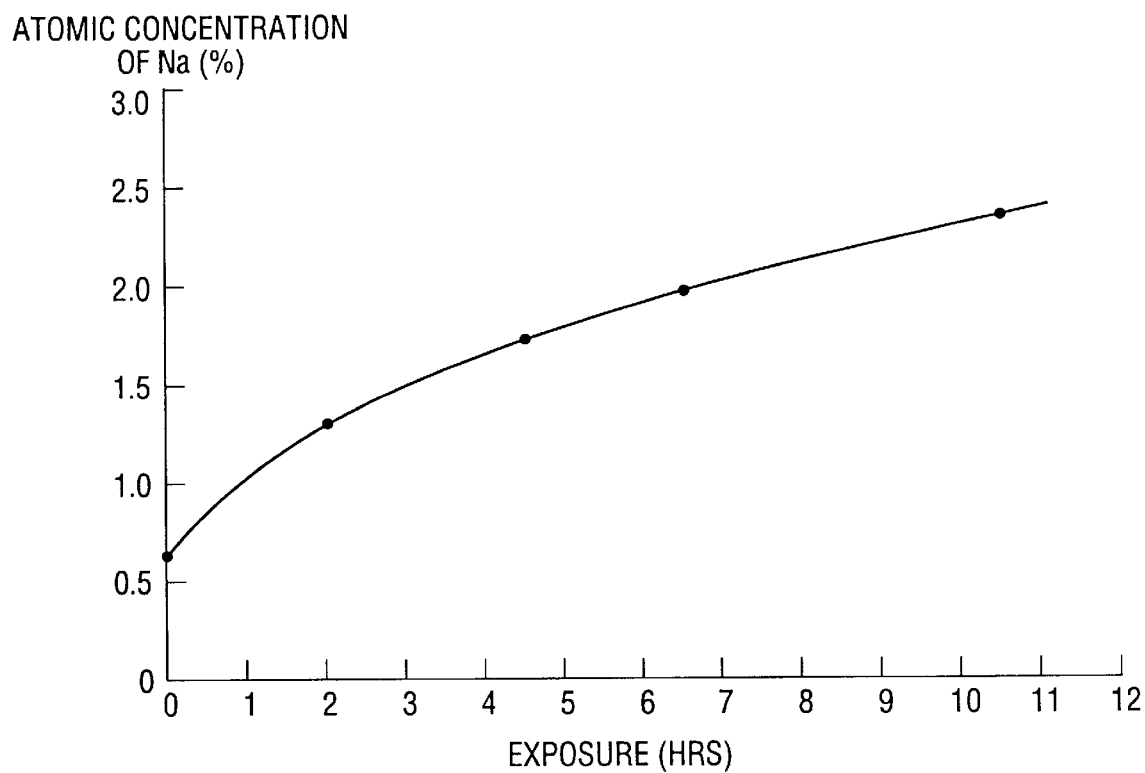
FIG. 8 illustrates the relative atomic concentration of sodium of the darkened areas as a function of increasing time of exposure to the soft x-rays.

FIG. 8 shows the relative atomic concentration of sodium in the darkened area as a function of the increasing time of exposure to the soft x-rays. The data indicate that a higher concentration of the sodium appears in the surface region of the darkened area after a longer period of exposure. While an understanding is not necessary, it is believed that a possible explanation for this enhancement is that trapped photoelectrons near the top surface layer of the glass attract the mobile sodium ions, thereby causing more sodium to appear in the surface region. It was assumed that some of the photoelectrons generated by the soft x-rays were trapped at the sites of oxygen vacancies (missing oxygen atoms in the Si—O glass structure). The presence of sodium ions is expected because the mobile ions can account for the electrical conductivity of glass containing sodium. The mobile sodium ions could come from the photo-dissociation of the impurity centers in the glass. Photo-dissociation is a process of breaking the molecular structure into positive and negative ions by using light (in our case, x-rays). The trapped photoelectron sites with the surrounding sodium ions are the possible color centers, and the selective absorption of visible light accounts for the observed brown color.

EXAMPLE 2

In this example, a thin glass plate, at room temperature, was again cut from an ordinary microscope slide and exposed to soft x-rays from the same 300-watt source used in Example 1. A mask comprising a 1.5 millimeter thick nickel foil having square holes approximately 75 micron on a side (Metrigraphics, Wilmington, Mass.), was placed over, and in contact with, the glass plate surface. The mask and glass plate were then exposed to the soft x-rays. The soft x-rays passing through the square holes darkened the exposed glass surface such that the darkened areas were clearly visible under a microscope.

From the above it is clear that the present invention provides for a simple, inexpensive, and accurate method of imaging x-ray lithography patterns for x-ray mask inspections.

We claim:

1. A method for forming a hologram in a glass surface, comprising the steps of:

a. providing a soft x-ray laser source, a glass surface, a splitting means and an object;

b. positioning said splitting means between said glass surface and said soft x-ray laser source;

c. projecting a laser beam from said soft x-ray laser source toward said splitting means; and d. splitting said laser beam into first and second coherent beams whereby said first beam travels toward and strikes said glass surface and said second beam reflects off said object and travels toward and strikes said glass surface whereby a hologram image of said object is formed on said glass surface.

2. The method of claim 1, wherein said splitting means comprises mirrors.

3. The method of claim 1, wherein said splitting means comprises a surface layer coating of Molybdenum-Silicon.

4. A glass surface having a hologram produced according to the method of claim 1.

5. A method of forming an image on a glass surface using soft x-rays, comprising the steps of:

a) providing a source of soft x-rays, a glass surface, and an object; and b) exposing said glass surface to soft x-rays from said source of soft x-rays, whereby an image is formed on said glass surface, said image corresponding to areas on said glass surface exposed to said soft x-rays, wherein said exposing further comprises the steps of:

i) positioning a splitting means between said glass surface and said source of soft x-rays; and ii) splitting said soft x-rays into two coherent beams whereby i) a first beam directly strikes said glass surface and ii) a second beam strikes an object and is then reflected toward and strikes said glass surface, whereby said first and second beams discolor said glass surface in such a way as to form an image of said object on said glass surface.

6. A glass surface having an image produced according to the method of claim 5.

7. The method of claim 5, wherein said source of soft x-rays is a soft x-ray laser.

8. The method of claim 5, wherein said source of soft x-rays is an x-ray tube.

9. The method of claim 5, wherein said splitting means comprises mirrors.

* * * * *